US012763755B2

(12) United States Patent
Khlat

(10) Patent No.: US 12,763,755 B2
(45) Date of Patent: Oct. 13, 2026

(54) TUNABLE COUPLED RESONATOR FILTER STRUCTURE

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 35 days.

(21) Appl. No.: 18/655,874

(22) Filed: May 6, 2024

(65) Prior Publication Data

US 2024/0413809 A1 Dec. 12, 2024

Related U.S. Application Data

(60) Provisional application No. 63/471,297, filed on Jun. 6, 2023.

(51) Int. Cl.
*H03H 9/58* (2006.01)
*H03H 9/02* (2006.01)

(52) U.S. Cl.
CPC ... *H03H 9/584* (2013.01); *H03H 2009/02165* (2013.01)

(58) Field of Classification Search
CPC ......... H03H 9/584; H03H 2009/02165; H03H 2009/02173; H03H 2009/02212
USPC .................................................. 333/186–187
See application file for complete search history.

(56) References Cited

U.S. PATENT DOCUMENTS 3,568,108 A * 3/1971 Poirier .................. H03H 9/584 333/187
4,697,115 A 9/1987 Mitsutsuka
4,924,195 A 5/1990 Gonda
6,242,843 B1 6/2001 Pohjonen et al.
(Continued)

FOREIGN PATENT DOCUMENTS

CN 107727125 A 2/2018
DE 102007028290 A1 1/2009
(Continued)

OTHER PUBLICATIONS

Elkholy, M. et al., "Low-Loss Integrated Passive CMOS Electrical Balance Duplexers With Single-Ended LNA," IEEE Transactions on Microwave Theory and Techniques, vol. 64, No. 5, May 2016, IEEE, pp. 1544-1559.
(Continued)

*Primary Examiner* — Andrea Lindgren Baltzell
*Assistant Examiner* — Victor Cole
(74) *Attorney, Agent, or Firm* — Withrow & Terranova, P.L.L.C.

(57) ABSTRACT

A tunable coupled resonator filter (CRF) structure is provided. Herein, the tunable CRF structure includes a ferroelectric input shunt resonator, a ferroelectric series resonator, and a ferroelectric output shunt resonator. The tunable CRF structure also includes a coupling layer that is coupled to the ferroelectric input shunt resonator, the ferroelectric series resonator, and the ferroelectric output shunt resonator. In embodiments disclosed herein, the coupling layer can be tuned by a tuning voltage to modify a parallel resonance frequency of the ferroelectric input shunt resonator and the ferroelectric output shunt resonator. As a result, it is possible to dynamically change the parallel resonance frequency of the tunable CRF structure based on various radio frequency (RF) filtering requirements.

18 Claims, 7 Drawing Sheets

(56) References Cited

U.S. PATENT DOCUMENTS

| | | | | |
|---|---|---|---|---|
| 6,862,441 | B2 | 3/2005 | Ella | |
| 7,034,638 | B2 | 4/2006 | Yamamoto et al. | |
| 7,161,434 | B2 | 1/2007 | Rhodes | |
| 7,367,095 | B2 | 5/2008 | Larson, III et al. | |
| 7,454,178 | B2 | 11/2008 | Block et al. | |
| 7,573,354 | B2 | 8/2009 | Nishihara et al. | |
| 7,656,228 | B2 | 2/2010 | Fukuda et al. | |
| 7,659,796 | B2 | 2/2010 | Funami et al. | |
| 7,692,270 | B2 | 4/2010 | Subramanyam et al. | |
| 7,791,436 | B2 | 9/2010 | Bardal et al. | |
| 7,804,374 | B1 | 9/2010 | Brown et al. | |
| 7,876,179 | B2 | 1/2011 | Bauer et al. | |
| 8,269,577 | B2 | 9/2012 | Inoue et al. | |
| 8,576,024 | B2 | 11/2013 | Erb et al. | |
| 8,620,250 | B2 | 12/2013 | Erb | |
| 9,041,484 | B2 | 5/2015 | Burgener et al. | |
| 9,190,979 | B2 | 11/2015 | Granger-Jones et al. | |
| 9,255,912 | B2 | 2/2016 | Johnston et al. | |
| 9,281,800 | B2 | 3/2016 | Tsuzuki | |
| 9,438,202 | B2 | 9/2016 | Reinhardt et al. | |
| 9,583,806 | B2 | 2/2017 | Cho et al. | |
| 9,705,473 | B2 | 7/2017 | David et al. | |
| 9,819,327 | B2 | 11/2017 | Maruthamuthu et al. | |
| 9,847,769 | B2 | 12/2017 | Khlat et al. | |
| 10,009,010 | B2 | 6/2018 | Kando et al. | |
| 10,243,537 | B2 | 3/2019 | Khlat | |
| 10,425,061 | B1 | 9/2019 | Varela Campelo | |
| 10,447,322 | B2 | 10/2019 | Wloczysiak | |
| 10,476,481 | B2 | 11/2019 | Chen et al. | |
| 10,873,317 | B2 | 12/2020 | Shen et al. | |
| 10,985,731 | B2 | 4/2021 | Khlat | |
| 11,050,412 | B2 | 6/2021 | Khlat et al. | |
| 11,095,268 | B2 | 8/2021 | Schmidhammer | |
| 11,165,412 | B2 | 11/2021 | Khlat et al. | |
| 11,165,413 | B2 | 11/2021 | Khlat et al. | |
| 11,323,097 | B2 | 5/2022 | Kankar et al. | |
| 11,742,818 | B2 | 8/2023 | Khlat | |
| 2002/0021192 | A1 | 2/2002 | Klee et al. | |
| 2002/0158717 | A1 | 10/2002 | Toncich | |
| 2002/0163400 | A1 | 11/2002 | Toncich | |
| 2003/0227338 | A1 | 12/2003 | Kawakubo et al. | |
| 2004/0119561 | A1 | 6/2004 | Omote | |
| 2006/0098723 | A1 | 5/2006 | Toncich et al. | |
| 2007/0030096 | A1 | 2/2007 | Nishihara et al. | |
| 2007/0107519 | A1 | 5/2007 | Liu et al. | |
| 2007/0131032 | A1 | 6/2007 | Liu | |
| 2007/0296513 | A1 | 12/2007 | Ruile et al. | |
| 2008/0024243 | A1 | 1/2008 | Iwaki et al. | |
| 2008/0065290 | A1 | 3/2008 | Breed et al. | |
| 2008/0129416 | A1 | 6/2008 | Volatier et al. | |
| 2009/0289526 | A1* | 11/2009 | Sinha | H10N 30/50 310/325 |
| 2009/0315643 | A1 | 12/2009 | Yamakawa et al. | |
| 2010/0308933 | A1 | 12/2010 | See et al. | |
| 2011/0309896 | A1 | 12/2011 | Loseu | |
| 2012/0212304 | A1 | 8/2012 | Zhang et al. | |
| 2012/0313731 | A1 | 12/2012 | Burgener et al. | |
| 2013/0109332 | A1 | 5/2013 | Aigner | |
| 2014/0070905 | A1 | 3/2014 | Raieszadeh et al. | |
| 2014/0203887 | A1 | 7/2014 | Murata et al. | |
| 2015/0163044 | A1 | 6/2015 | Analui et al. | |
| 2015/0333401 | A1* | 11/2015 | Maruthamuthu | H01Q 5/335 343/861 |
| 2016/0191012 | A1 | 6/2016 | Khlat et al. | |
| 2016/0191016 | A1 | 6/2016 | Khlat et al. | |
| 2016/0294423 | A1 | 10/2016 | Yatsenko et al. | |
| 2017/0040948 | A1 | 2/2017 | Levesque | |
| 2017/0048859 | A1 | 2/2017 | Hayakawa | |
| 2017/0093370 | A1 | 3/2017 | Khlat et al. | |
| 2017/0201233 | A1 | 7/2017 | Khlat | |
| 2017/0214389 | A1 | 7/2017 | Tsutsumi | |
| 2017/0230066 | A1 | 8/2017 | Little et al. | |
| 2017/0244382 | A1 | 8/2017 | Lear | |
| 2017/0264268 | A1 | 9/2017 | Schmidhammer | |
| 2018/0076793 | A1 | 3/2018 | Khlat et al. | |
| 2018/0123562 | A1 | 5/2018 | Bradley | |
| 2018/0159562 | A1 | 6/2018 | Bauder | |
| 2018/0234078 | A1 | 8/2018 | Wada et al. | |
| 2019/0081613 | A1 | 3/2019 | Nosaka | |
| 2019/0181907 | A1 | 6/2019 | Pfann et al. | |
| 2019/0199324 | A1 | 6/2019 | Matsumoto et al. | |
| 2019/0260355 | A1 | 8/2019 | Khlat | |
| 2019/0326944 | A1 | 10/2019 | Khlat et al. | |
| 2019/0393860 | A1 | 12/2019 | Shih et al. | |
| 2020/0028491 | A1 | 1/2020 | Kuroyanagi | |
| 2020/0028567 | A1 | 1/2020 | Ashworth | |
| 2020/0076366 | A1 | 3/2020 | Bahr et al. | |
| 2020/0099360 | A1 | 3/2020 | Khlat | |
| 2020/0099362 | A1 | 3/2020 | Khlat | |
| 2020/0099363 | A1 | 3/2020 | Khlat | |
| 2020/0099364 | A1 | 3/2020 | Khlat | |
| 2020/0136589 | A1 | 4/2020 | Khlat | |
| 2020/0162057 | A1 | 5/2020 | Nakamura | |
| 2020/0274519 | A1 | 8/2020 | Gamble et al. | |
| 2021/0067139 | A1 | 3/2021 | Komatsu et al. | |
| 2021/0194459 | A1 | 6/2021 | Alavi et al. | |
| 2021/0297097 | A1 | 9/2021 | Okuda | |
| 2021/0399750 | A1 | 12/2021 | Varela Campelo | |
| 2022/0385272 | A1 | 12/2022 | Sun et al. | |
| 2023/0083961 | A1 | 3/2023 | Komatsu et al. | |
| 2023/0093885 | A1 | 3/2023 | Ella et al. | |
| 2023/0134889 | A1 | 5/2023 | Costa | |
| 2023/0216485 | A1 | 7/2023 | Wu et al. | |
| 2023/0223920 | A1 | 7/2023 | Koohi et al. | |
| 2023/0223922 | A1 | 7/2023 | Koohi et al. | |
| 2023/0223926 | A1 | 7/2023 | Koohi et al. | |
| 2023/0299746 | A1 | 9/2023 | Levesque | |
| 2023/0318569 | A1 | 10/2023 | Jhung | |
| 2023/0402992 | A1 | 12/2023 | Noguchi et al. | |
| 2023/0412149 | A1* | 12/2023 | Khlat | H03H 9/605 |
| 2024/0014803 | A1 | 1/2024 | Khlat | |
| 2024/0053193 | A1 | 2/2024 | Khlat | |
| 2024/0097650 | A1 | 3/2024 | Khlat et al. | |
| 2024/0213956 | A1 | 6/2024 | Khlat et al. | |
| 2024/0258992 | A1 | 8/2024 | Khlat | |
| 2024/0333257 | A1 | 10/2024 | Khlat | |
| 2024/0333259 | A1 | 10/2024 | Khlat | |
| 2024/0364309 | A1 | 10/2024 | Khlat | |
| 2025/0030404 | A1* | 1/2025 | Khlat | H03H 9/605 |

FOREIGN PATENT DOCUMENTS

| | | | |
|---|---|---|---|
| JP | 3854212 | B2 | 12/2006 |
| JP | 2009130831 | A | 6/2009 |
| JP | 4326063 | B2 | 9/2009 |
| JP | 2022548348 | A | 11/2022 |
| RU | 166154 | U1 | 11/2016 |
| WO | 2024034528 | A1 | 2/2024 |

OTHER PUBLICATIONS

Kang, P. et al., "Dual-Band CMOS RF Front-End Employing an Electrical-Balance Duplexer an N-Path LNA for IBFD and FDD Radios," IEEE Transactions on Microwave Theory and Techniques, vol. 69, No. 7, Jul. 2021, IEEE, pp. 3528-3539.

Yu, X., "Design of reconfigurable multi-mode RF circuits," A dissertation submitted to the graduate faculty in partial fulfillment of the requirements for the degree of Doctor of Philosophy, Iowa State University, Ames, Iowa, 2013, 127 pages.

Khan, A.I. et al., "Negative Capacitance in a Ferroelectric Capacitor," Nature Materials, vol. 14, Feb. 2015, first published Dec. 2014, Macmillan Publishers Limited, pp. 182-186.

Ghosh, S. et al., "Experimental Observation of Electron-Phonon Interaction in Semiconductor on Solidly Mounted Thin-Film Lithium Niobate," 2022 IEEE MTT-S International Conference on Microwave Acoustics and Mechanics (IC-MAM), Jul. 18-20, 2022, Munich, Germany, IEEE, 4 pages.

Gokhale, V. et al., "Phonon-Electron Interactions in Piezoelectric Semiconductor Bulk Acoustic Wave Resonators," Scientific Reports, vol. 4, Article No. 5617, Jul. 2014, 10 pages.

Sis, S.A., "Ferroelectric-on-Silicon Switchable Bulk Acoustic Wave Resonators and Filters for RF Applications," A dissertation submit-

(56) References Cited

OTHER PUBLICATIONS ted in partial fulfillment of the requirements for the degree of Doctor of Philosophy (Electrical Engineering) in The University of Michigan, 2014, 152 pages.
Tirado, J.V., "Bulk Acoustic Wave Resonators and their Application to Microwave Devices," Ph.D Dissertation, Department of Telecommunications and Systems Engineering, Universitat Autònoma de Barcelona (UAB), 2010, 201 pages.
Qorvo US, Inc., "Acoustic LP filtering for High Frequency Spurious Harmonics Rejections," Technical Disclosure Commons, Dec. 13, 2022, Qorvo US, Inc., 8 pages.
Qorvo US, Inc., "Multipe Notch Filter Using On-Die BAW MIM Cap," Technical Disclosure Commons, Dec. 12, 2022, Qorvo US, Inc., 10 pages.

* cited by examiner

TUNABLE COUPLED RESONATOR FILTER STRUCTURE

RELATED APPLICATIONS

This application claims the benefit of U.S. provisional patent application Ser. No. 63/471,297, filed on Jun. 6, 2023, the disclosure of which is hereby incorporated herein by reference in its entirety.

FIELD OF THE DISCLOSURE

The technology of the disclosure relates generally to tuning of a coupled resonator filter (CRF) structure, such as a coupled ferroelectric resonator filter.

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications.

Ferroelectric acoustic resonators, such as ferroelectric bulk acoustic resonators (FBARs), offer ultra-small sizes and can operate at frequencies up to tens of gigahertz. As such, ferroelectric resonators are widely used as miniaturized filters in many high-frequency devices, such as fifth generation (5G) and 5G new radio (5G-NR) communication and/or navigation devices. The operating frequency (a.k.a. series/parallel resonance frequency) of a ferroelectric acoustic resonator is typically determined by an inner structure (e.g., thickness and elastic properties) of the ferroelectric acoustic resonator. As such, it is desirable to electrically control the ferroelectric acoustic resonator to operate at a desired operating frequency without changing the inner structure of the ferroelectric acoustic resonator.

SUMMARY

Aspects disclosed in the detailed description include a tunable coupled resonator filter (CRF) structure. Herein, the tunable CRF structure includes a ferroelectric input shunt resonator, a ferroelectric series resonator, and a ferroelectric output shunt resonator. The tunable CRF structure also includes a coupling layer that is coupled to the ferroelectric input shunt resonator, the ferroelectric series resonator, and the ferroelectric output shunt resonator. In embodiments disclosed herein, the coupling layer can be tuned by a tuning voltage to modify a parallel resonance frequency of the ferroelectric input shunt resonator and the ferroelectric output shunt resonator. As a result, it is possible to dynamically change the parallel resonance frequency of the tunable CRF structure based on various radio frequency (RF) filtering requirements.

In one aspect, a tunable CRF structure is provided. The tunable CRF structure includes a ferroelectric input shunt resonator. The ferroelectric input shunt resonator is coupled to an input node and configured to resonate in a parallel resonance frequency. The tunable CRF structure also includes a ferroelectric output shunt resonator. The ferroelectric output shunt resonator is coupled to an output node and configured to resonate in the parallel resonance frequency. The tunable CRF structure also includes a ferroelectric series resonator. The ferroelectric series resonator is provided between the ferroelectric input shunt resonator and the ferroelectric output shunt resonator and configured to resonate in a series resonance frequency. The tunable CRF structure also includes a coupling layer. The coupling layer is configured to be polarized relative to the ferroelectric input shunt resonator and the ferroelectric output shunt resonator to thereby modify the parallel resonance frequency.

In another aspect, an acoustic ladder filter network is provided. The acoustic ladder filter network includes multiple tunable CRF structures. Each of the multiple tunable CRF structures includes a ferroelectric input shunt resonator. The ferroelectric input shunt resonator is coupled to an input node and configured to resonate in a parallel resonance frequency. Each of the multiple tunable CRF structures also includes a ferroelectric output shunt resonator. The ferroelectric output shunt resonator is coupled to an output node and configured to resonate in the parallel resonance frequency. Each of the multiple tunable CRF structures also includes a ferroelectric series resonator. The ferroelectric series resonator is provided between the ferroelectric input shunt resonator and the ferroelectric output shunt resonator and is configured to resonate in a series resonance frequency. Each of the multiple tunable CRF structures also includes a coupling layer. The coupling layer is configured to be polarized relative to the ferroelectric input shunt resonator and the ferroelectric output shunt resonator to thereby modify the parallel resonance frequency.

In another aspect, a wireless device is provided. The wireless device includes at least one tunable CRF structure. The at least one tunable CRF structure includes a ferroelectric input shunt resonator. The ferroelectric input shunt resonator is coupled to an input node and configured to resonate in a parallel resonance frequency. The at least one tunable CRF structure also includes a ferroelectric output shunt resonator. The ferroelectric output shunt resonator is coupled to an output node and configured to resonate in the parallel resonance frequency. The at least one tunable CRF structure also includes a ferroelectric series resonator. The ferroelectric series resonator is provided between the ferroelectric input shunt resonator and the ferroelectric output shunt resonator and configured to resonate in a series resonance frequency. The at least one tunable CRF structure also includes a coupling layer. The coupling layer is configured to be polarized relative to the ferroelectric input shunt resonator and the ferroelectric output shunt resonator to thereby modify the parallel resonance frequency.

In another aspect, a method for tuning a parallel resonance frequency in a tunable CRF structure is provided. The method includes coupling a ferroelectric input shunt resonator to an input node to resonate in the parallel resonance frequency. The method also includes coupling a ferroelectric output shunt resonator to an output node to resonate in the parallel resonance frequency. The method also includes providing a ferroelectric series resonator between the ferroelectric input shunt resonator and the ferroelectric output shunt resonator to resonate in a series resonance frequency. The method also includes polarizing a coupling layer relative to the ferroelectric input shunt resonator and the ferroelectric output shunt resonator to thereby modify the parallel resonance frequency.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
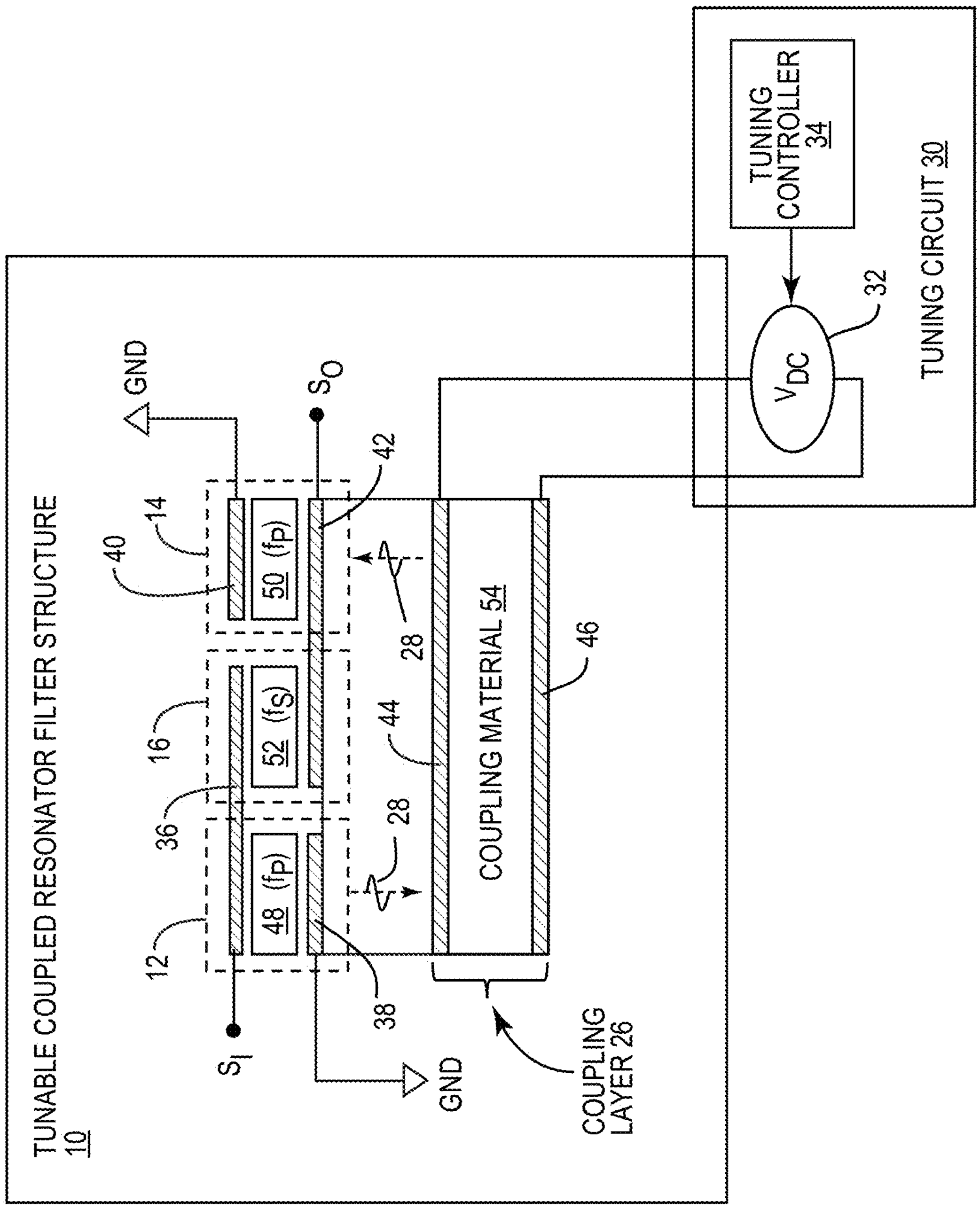
FIG. 1A is a schematic diagram of an exemplary sideview of a tunable coupled resonator filter (CRF) structure that can be tuned to change a parallel resonance frequency based on various embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a tunable coupled resonator filter (CRF) structure. Herein, the tunable CRF structure includes a ferroelectric input shunt resonator, a ferroelectric series resonator, and a ferroelectric output shunt resonator. The tunable CRF structure also includes a coupling layer that is coupled to the ferroelectric input shunt resonator, the ferroelectric series resonator, and the ferroelectric output shunt resonator. In embodiments disclosed herein, the coupling layer can be tuned by a tuning voltage to modify a parallel resonance frequency of the ferroelectric input shunt resonator and the ferroelectric output shunt resonator. As a result, it is possible to dynamically change the parallel resonance frequency of the tunable CRF structure based on various radio frequency (RF) filtering requirements.

FIG. 1A is a schematic diagram of an exemplary sideview of a tunable CRF structure 10 that can be tuned to change a parallel resonance frequency $f_P$ based on various embodiments of the present disclosure. Herein, the tunable CRF structure 10 includes a ferroelectric input shunt resonator 12, a ferroelectric output shunt resonator 14, and a ferroelectric series resonator 16. The ferroelectric input shunt resonator 12 is coupled to an input node $S_I$ and the ferroelectric output shunt resonator 14 is coupled to an output node $S_O$. The ferroelectric series resonator 16 is coupled in between the ferroelectric input shunt resonator 12 and the ferroelectric output shunt resonator 14.

Figure 1B:
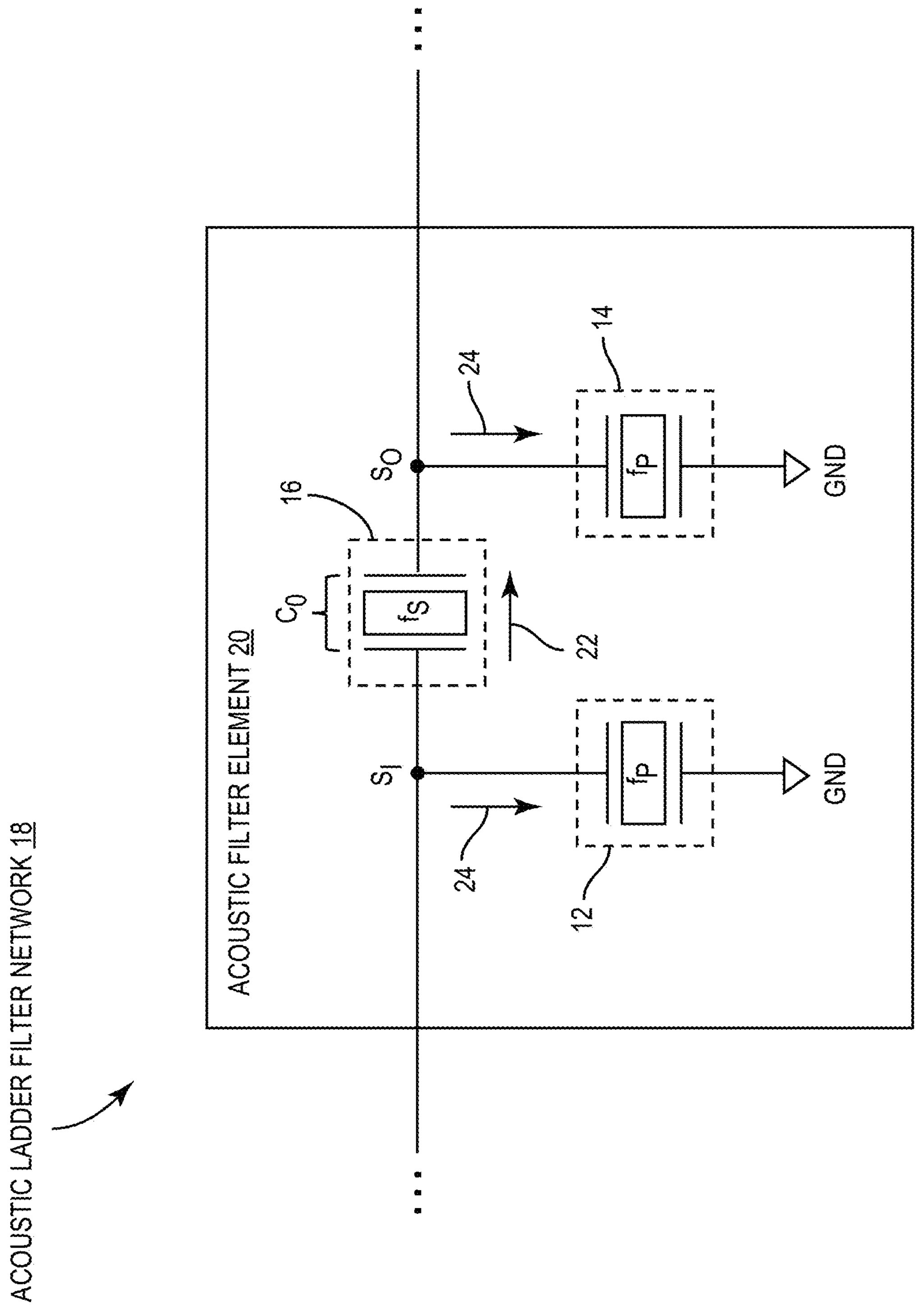
FIG. 1B is a schematic diagram of an acoustic ladder filter network that can include one or more of the tunable CRF structures in FIG. 1A.

In an embodiment, as illustrated in FIG. 1B, the ferroelectric input shunt resonator 12, the ferroelectric output shunt resonator 14, and the ferroelectric series resonator 16 can be used in an acoustic ladder filter network. In this regard, FIG. 1B is a schematic diagram of an acoustic ladder filter network 18 that can be formed based on the tunable CRF structure 10 of FIG. 1A. Common elements between FIGS. 1A and 1B are shown therein with common element numbers and will not be re-described herein.

The acoustic ladder filter network 18 can include at least one acoustic filter element 20 formed by the tunable CRF structure 10 in FIG. 1A. Specifically, the ferroelectric series resonator 16 is formed to resonate at a series resonance frequency $f_S$ to provide a series path 22 between the input node $S_I$ and the output node $S_O$. The ferroelectric input shunt resonator 12 and the ferroelectric output shunt resonator 14, on the other hand, are each formed to resonate at the parallel resonance frequency $f_P$ to provide a shunt path 24. Understandably, the acoustic ladder filter network 18 can be configured to include more than one of the acoustic filter elements 20.

Unfortunately, the ferroelectric series resonator 16 can present an electrical-static capacitance $C_0$ between the input node $S_I$ and the output node $S_O$. The electrical-static capacitance $C_0$ can cause the ferroelectric series resonator 16 to resonate at a secondary frequency that falls within the parallel resonance frequency $f_P$ to potentially compromise a signal rejection capability of the acoustic filter element 20. As such, it is necessary to cancel the electrical-static capacitance $C_0$ at a frequency range of interest to help improve performance of the acoustic filter element 20.

In this regard, with reference back to FIG. 1A, the tunable CRF structure 10 can be tuned to create a coupling between the ferroelectric input shunt resonator 12 and the ferroelectric output shunt resonator 14 to help cancel the electrical-static capacitance $C_0$. In an embodiment, the tunable CRF structure 10 can include a coupling layer 26 that is coupled to the ferroelectric input shunt resonator 12, the ferroelectric output shunt resonator 14, and the ferroelectric series resonator 16. The coupling layer 26 can be polarized relative to the ferroelectric input shunt resonator 12 and the ferroelectric output shunt resonator 14 when a tuning voltage $V_{DC}$ (e.g., 20 V) is applied to the coupling layer 26. Accordingly, the coupling acoustic behavior of the coupling layer 26 can be modified to thereby change a phase and/or amplitude of an out-of-band signal 28 coupled between the ferroelectric input shunt resonator 12 and the ferroelectric output shunt resonator 14. As a result, it is possible to cancel the electrical-static capacitance $C_0$ at the frequency range of interest and thereby improve performance of the tunable CRF structure 10.

In an embodiment, the coupling layer 26 may be coupled to a tuning circuit 30 that includes a voltage source 32 and a tuning controller 34. The tuning controller 34 can be configured to control the voltage source 32 to provide the tuning voltage $V_{DC}$ to the coupling layer 26 to thereby change the coupling acoustic behavior of the coupling layer 26.

According to an embodiment of the present disclosure, the tunable CRF structure 10 includes a first input electrode 36, a second input electrode 38, a first output electrode 40, a second output electrode 42, a first coupling electrode 44, and a second coupling electrode 46. Specifically, the ferroelectric input shunt resonator 12 is formed by a first piezoelectric layer 48 provided between the first input electrode 36 and the second input electrode 38, the ferroelectric output shunt resonator 14 is formed by a second piezoelectric layer 50 provided between the first output electrode 40 and the second output electrode 42, and the ferroelectric series resonator 16 is formed by a third piezoelectric layer 52 provided between the first input electrode 36 and the second output electrode 42. The coupling layer 26, on the other hand, is formed by a coupling material 54 provided between the first coupling electrode 44 and the second coupling electrode 46. In a non-limiting example, the coupling material 54 can be a ferroelectric material. In another non-limiting example, the coupling material 54 can also be a piezoelectric semiconductor bulk acoustic wave (PS-BAW) resonator.

In an embodiment, the first input electrode 36 is coupled to the input node $S_I$ and the second output electrode 42 is coupled to the output node $S_O$. The second input electrode 38 and the first output electrode 40 are both coupled to a ground (GND). The tuning voltage $V_{DC}$ is applied between the first coupling electrode 44 and the second coupling electrode 46.

Figure 2:
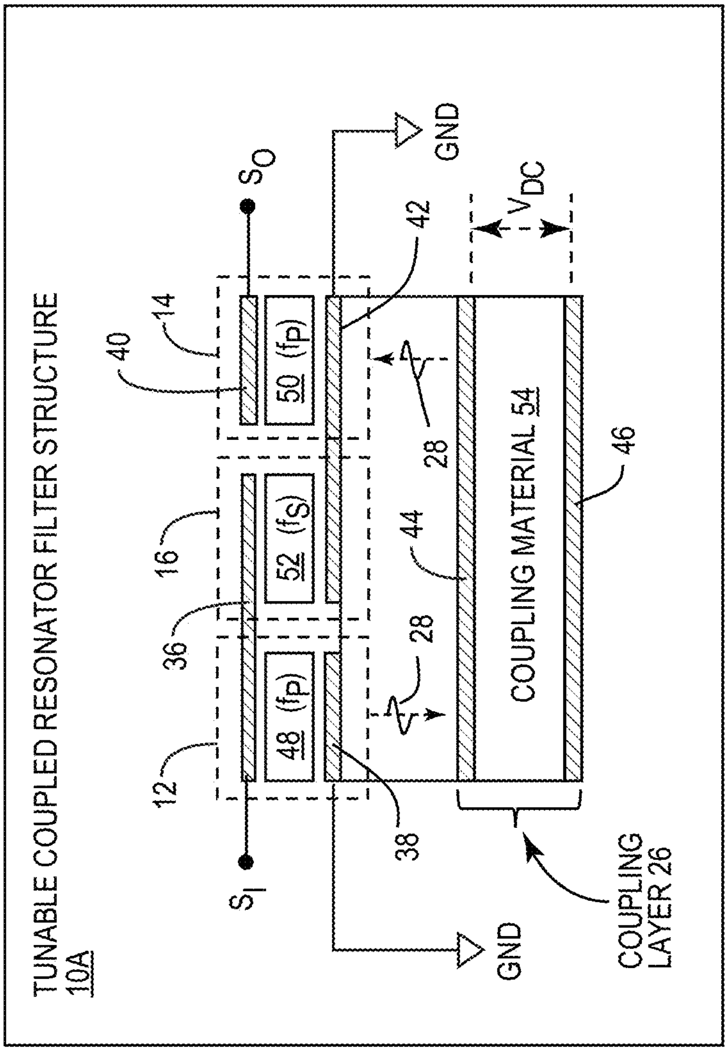
FIG. 2 is a schematic diagram of an exemplary sideview of a tunable CRF structure configured according to another embodiment of the present disclosure.
Figure 3:
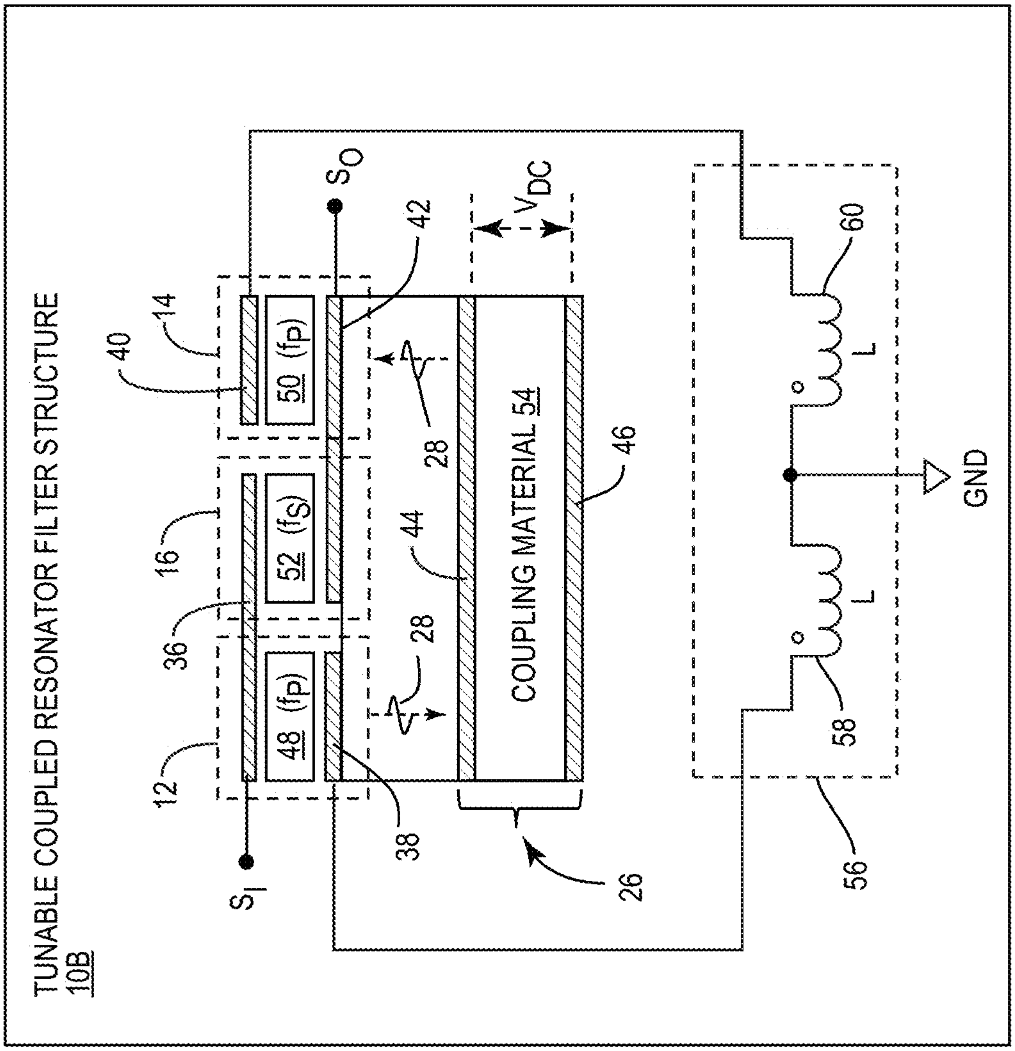
FIG. 3 is a schematic diagram of an exemplary sideview of a tunable CRF structure configured according to another embodiment of the present disclosure.
Figure 4:
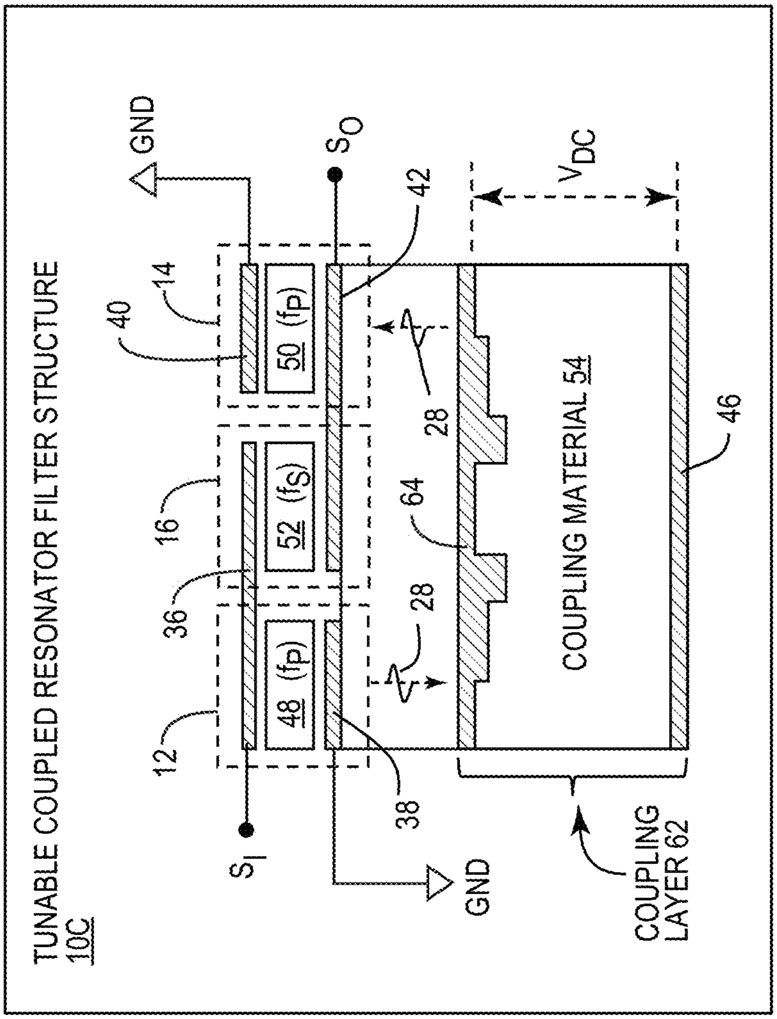
FIG. 4 is a schematic diagram of an exemplary sideview of a tunable CRF structure configured according to another embodiment of the present disclosure.

The tunable CRF structure 10 can also be configured according to multiple alternative embodiments, as shown next in FIGS. 2, 3, and 4. Common elements between FIGS. 1A and 2-4 are shown therein with common element numbers and will not be re-described herein.

FIG. 2 is a schematic diagram of an exemplary sideview of a tunable CRF structure 10A configured according to another embodiment of the present disclosure. Herein, the first output electrode 40 is coupled to the output node $S_O$ and the second output electrode 42 is coupled to the GND. In this embodiment, the first piezoelectric layer 48 can be a c-type piezoelectric layer and the second piezoelectric layer 50 can be an f-type piezoelectric layer.

FIG. 3 is a schematic diagram of an exemplary sideview of a tunable CRF structure 10B configured according to another embodiment of the present disclosure. Herein, the second input electrode 38 and the first output electrode 40 are coupled to a transformer 56, which includes a pair of negatively coupled inductors 58, 60. The pair of negatively coupled inductors 58, 60 are coupled by a mutual coupling factor M, which is a function of a negative coupling factor k and inductance L of the negatively coupled inductors 58, 60 (M=−k*L). In this embodiment, the negatively coupled inductors 58, 60 can be coupled to the second input electrode 38 and the first output electrode 40 via respective vias.

FIG. 4 is a schematic diagram of an exemplary sideview of a tunable CRF structure 10C configured according to another embodiment of the present disclosure. Herein, the tunable CRF structure 10C includes a coupling layer 62. The coupling layer 62 includes a first coupling electrode 64 with multiple thicknesses (a.k.a. uneven thickness). In an embodiment, the multiple thicknesses may provide multiple frequency coupling responses.

Figure 5:
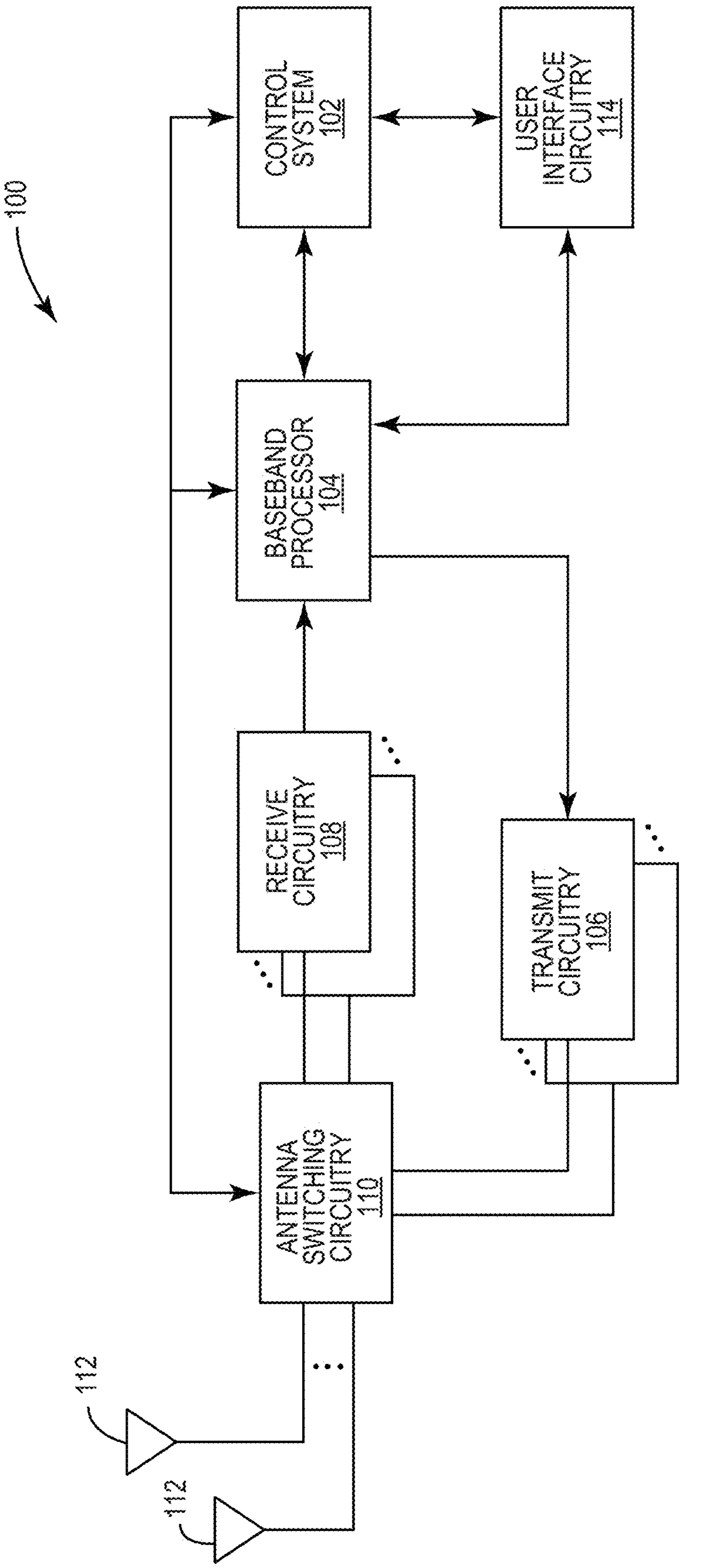
FIG. 5 is a schematic diagram of an exemplary communication device wherein the tunable CRF structure of FIGS. 1A, 2, 3, and 4 can be provided.

The tunable CRF structure 10 of FIG. 1A, the tunable CRF structure 10A of FIG. 2, the tunable CRF structure 10B of FIG. 3, and the tunable CRF structure 10C of FIG. 4 can be provided in a communication device to support the embodiments described above. In this regard, FIG. 5 is a schematic diagram of an exemplary communication device 100 wherein the tunable CRF structure 10 of FIG. 1A, the tunable CRF structure 10A of FIG. 2, the tunable CRF structure 10B of FIG. 3, and the tunable CRF structure 10C of FIG. 4 can be provided.

Herein, the communication device 100 can be any type of communication device, such as mobile terminal, smart watch, tablet, computer, navigation device, access point, base station (e.g., eNB, gNB, etc.), and like wireless communication devices that support wireless communications, such as cellular, wireless local area network (WLAN), Bluetooth, Ultra-wideband (UWB), and near field communications. The communication device 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using an analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Figure 6:
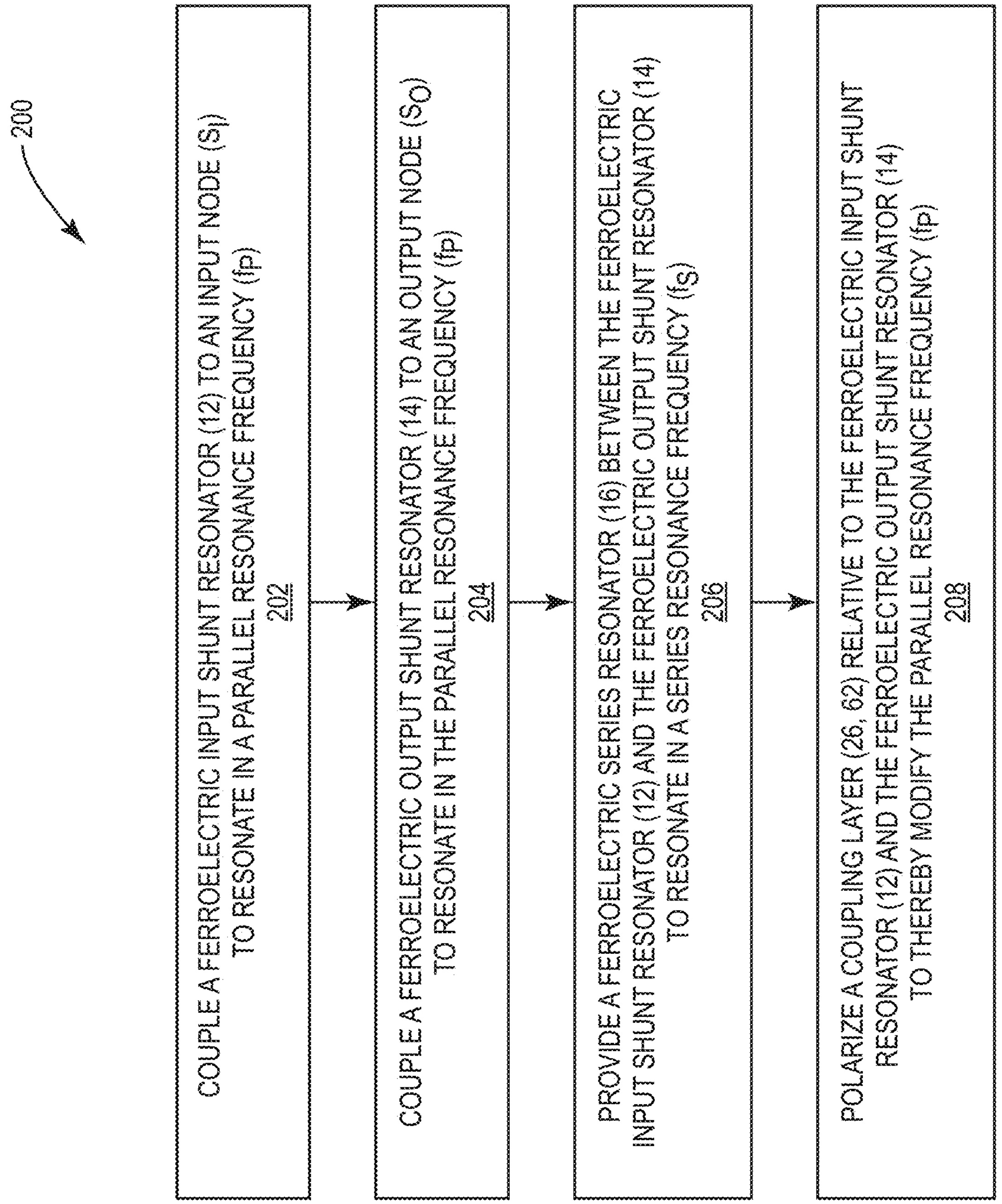
FIG. 6 is a flowchart of an exemplary process for tuning the parallel resonance frequency in the tunable CRF structure of FIGS. 1A, 2, 3, and 4.

In an embodiment, the tunable CRF structure 10 of FIG. 1A, the tunable CRF structure 10A of FIG. 2, the tunable CRF structure 10B of FIG. 3, and the tunable CRF structure 10C of FIG. 4 can be tuned to change the parallel resonance frequency $f_P$ in accordance with a process. In this regard, FIG. 6 is a flowchart of an exemplary process 200 for tuning the parallel resonance frequency $f_P$ in the tunable CRF structure 10 of FIG. 1A, the tunable CRF structure 10A of FIG. 2, the tunable CRF structure 10B of FIG. 3, and the tunable CRF structure 10C of FIG. 4.

Herein, the process 200 includes coupling the ferroelectric input shunt resonator 12 to the input node $S_I$ to resonate in the parallel resonance frequency $f_P$ (step 202). The process 200 also includes coupling the ferroelectric output shunt resonator 14 to the output node $S_O$ to resonate in the parallel resonance frequency $f_P$ (step 204). The process 200 also includes providing the ferroelectric series resonator 16 between the ferroelectric input shunt resonator 12 and the ferroelectric output shunt resonator 14 to resonate in the series resonance frequency $f_S$ (step 206). The process 200 also includes polarizing the coupling layer 26 or the coupling layer 62 relative to the ferroelectric input shunt resonator 12 and the ferroelectric output shunt resonator 14 to thereby modify the parallel resonance frequency $f_P$ (step 208).

Those skilled in the art will recognize improvements and modifications to the embodiments of the present disclosure. All such improvements and modifications are considered within the scope of the concepts disclosed herein and the claims that follow.

What is claimed is:

1. A tunable coupled resonator filter (CRF) structure comprising:
- a ferroelectric input shunt resonator coupled to an input node and configured to resonate in a parallel resonance frequency;
- a ferroelectric output shunt resonator coupled to an output node and configured to resonate in the parallel resonance frequency;
- a ferroelectric series resonator provided between the ferroelectric input shunt resonator and the ferroelectric output shunt resonator and configured to resonate in a series resonance frequency; and
- a ferroelectric coupling layer configured to be polarized relative to the ferroelectric input shunt resonator and the ferroelectric output shunt resonator to thereby modify the parallel resonance frequency to prevent a secondary frequency caused by an electrical-static capacitance of the ferroelectric series resonator from overlapping with the parallel resonance frequency.

2. The tunable CRF structure of claim 1, wherein the ferroelectric coupling layer is coupled to a tuning circuit and configured to be polarized relative to the ferroelectric input shunt resonator and the ferroelectric output shunt resonator in response to receiving a tuning voltage from the tuning circuit.

3. The tunable CRF structure of claim 1, wherein:
- the ferroelectric input shunt resonator comprises:
  - a first input electrode and a second input electrode; and
  - a first piezoelectric layer provided between the first input electrode and the second input electrode;
- the ferroelectric output shunt resonator comprises:
  - a first output electrode and a second output electrode; and
  - a second piezoelectric layer provided between the first output electrode and the second output electrode;
- the ferroelectric series resonator comprises:
  - the first input electrode and the second output electrode; and
  - a third piezoelectric layer provided between the first input electrode and the second output electrode; and
- the ferroelectric coupling layer comprises:
  - a first coupling electrode and a second coupling electrode; and
  - a coupling material provided between the first coupling electrode and the second coupling electrode.

4. The tunable CRF structure of claim 3, wherein the coupling material is made of a ferroelectric material.

5. The tunable CRF structure of claim 3, wherein:
- the first input electrode is coupled to the input node;
- the second output electrode is coupled to the output node; and
- the second input electrode and the first output electrode are each coupled to a ground.

6. The tunable CRF structure of claim 3, wherein:
- the first input electrode is coupled to the input node;
- the first output electrode is coupled to the output node; and
- the second input electrode and the second output electrode are each coupled to a ground.

7. The tunable CRF structure of claim 3, wherein:
- the first input electrode is coupled to the input node;
- the second output electrode is coupled to the output node; and
- the second input electrode and the first output electrode are each coupled to a transformer comprising a pair of negatively coupled inductors.

8. The tunable CRF structure of claim 3, wherein:
the first input electrode is coupled to the input node;
the second output electrode is coupled to the output node;
the second input electrode and the first output electrode are each coupled to a ground; and
the first coupling electrode is made with uneven thickness configured to provide multiple frequency coupling responses.

9. An acoustic ladder filter network comprising a plurality of tunable coupled resonator filter (CRF) structures each comprising:
a ferroelectric input shunt resonator coupled to an input node and configured to resonate in a parallel resonance frequency;
a ferroelectric output shunt resonator coupled to an output node and configured to resonate in the parallel resonance frequency;
a ferroelectric series resonator provided between the ferroelectric input shunt resonator and the ferroelectric output shunt resonator and configured to resonate in a series resonance frequency; and
a ferroelectric coupling layer configured to be polarized relative to the ferroelectric input shunt resonator and the ferroelectric output shunt resonator to thereby modify the parallel resonance frequency to prevent a secondary frequency caused by an electrical-static capacitance of the ferroelectric series resonator from overlapping with the parallel resonance frequency.

10. A wireless device comprising at least one tunable coupled resonator filter (CRF) structure, the at least one tunable CRF structure comprises:
a ferroelectric input shunt resonator coupled to an input node and configured to resonate in a parallel resonance frequency;
a ferroelectric output shunt resonator coupled to an output node and configured to resonate in the parallel resonance frequency;
a ferroelectric series resonator provided between the ferroelectric input shunt resonator and the ferroelectric output shunt resonator and configured to resonate in a series resonance frequency; and
a ferroelectric coupling layer configured to be polarized relative to the ferroelectric input shunt resonator and the ferroelectric output shunt resonator to thereby modify the parallel resonance frequency to prevent a secondary frequency caused by an electrical-static capacitance of the ferroelectric series resonator from overlapping with the parallel resonance frequency.

11. The wireless device of claim 10, wherein the ferroelectric coupling layer is coupled to a tuning circuit and configured to be polarized relative to the ferroelectric input shunt resonator and the ferroelectric output shunt resonator in response to receiving a tuning voltage from the tuning circuit.

12. The wireless device of claim 10, wherein:
the ferroelectric input shunt resonator comprises:
a first input electrode and a second input electrode; and
a first piezoelectric layer provided between the first input electrode and the second input electrode;
the ferroelectric output shunt resonator comprises:
a first output electrode and a second output electrode; and
a second piezoelectric layer provided between the first output electrode and the second output electrode;
the ferroelectric series resonator comprises:
the first input electrode and the second output electrode; and
a third piezoelectric layer provided between the first input electrode and the second output electrode; and
the ferroelectric coupling layer comprises:
a first coupling electrode and a second coupling electrode; and
a coupling material provided between the first coupling electrode and the second coupling electrode.

13. The wireless device of claim 12, wherein:
the first input electrode is coupled to the input node;
the second output electrode is coupled to the output node; and
the second input electrode and the first output electrode are each coupled to a ground.

14. The wireless device of claim 12, wherein:
the first input electrode is coupled to the input node;
the first output electrode is coupled to the output node; and
the second input electrode and the second output electrode are each coupled to a ground.

15. The wireless device of claim 14, wherein the first piezoelectric layer is a c-type piezoelectric layer, and the second piezoelectric layer is an f-type piezoelectric layer.

16. The wireless device of claim 12, wherein:
the first input electrode is coupled to the input node;
the second output electrode is coupled to the output node; and
the second input electrode and the first output electrode are each coupled to a transformer comprising a pair of negatively coupled inductors.

17. The wireless device of claim 12, wherein:
the first input electrode is coupled to the input node;
the second output electrode is coupled to the output node;
the second input electrode and the first output electrode are each coupled to a ground; and
the first coupling electrode is made with an uneven thickness configured to provide multiple frequency coupling responses.

18. A method for tuning a parallel resonance frequency in a tunable coupled resonator filter (CRF) structure comprising:
coupling a ferroelectric input shunt resonator to an input node to resonate in the parallel resonance frequency;
coupling a ferroelectric output shunt resonator to an output node to resonate in the parallel resonance frequency;
providing a ferroelectric series resonator between the ferroelectric input shunt resonator and the ferroelectric output shunt resonator to resonate in a series resonance frequency; and
polarizing a ferroelectric coupling layer relative to the ferroelectric input shunt resonator and the ferroelectric output shunt resonator to thereby modify the parallel resonance frequency to prevent a secondary frequency caused by an electrical-static capacitance of the ferroelectric series resonator from overlapping with the parallel resonance frequency.

* * * * *